United States Patent [19]

Nouhi et al.

[11] Patent Number: 4,935,383
[45] Date of Patent: Jun. 19, 1990

[54] PREPARATION OF DILUTE MAGNETIC SEMICONDUCTOR FILMS BY METALORGANIC CHEMICAL VAPOR DEPOSITION

[75] Inventors: Akbar Nouhi, Whittier; Richard J. Stirn, Diamond Bar, both of Calif.

[73] Assignee: The United States of America as represented by the Administrator of the National Aeronautics and Space Administration, Washington, D.C.

[21] Appl. No.: 248,019

[22] Filed: Sep. 23, 1988

[51] Int. Cl.$^5$ ............................................. H01L 21/20
[52] U.S. Cl. .................................. 437/81; 148/DIG. 1
[58] Field of Search ...................... 148/DIG. 1, 40, 41, 148/64, 72, 97, 40, 150, 153, 169, 172; 156/610-615; 427/252, 255, 255.2, 255.1; 437/81, 84, 101, 2-5, 105, 126, 133, 971

[56] References Cited

U.S. PATENT DOCUMENTS

| | | | |
|---|---|---|---|
| 3,146,137 | 8/1964 | Williams | 437/133 |
| 4,066,481 | 1/1978 | Manasevit et al. | 437/84 |
| 4,422,888 | 12/1983 | Stutius | 437/81 |
| 4,496,610 | 1/1985 | Cattell et al. | 427/255.2 |
| 4,566,918 | 1/1986 | Irvine et al. | 437/81 |
| 4,568,377 | 2/1986 | Hoke et al. | 437/81 |
| 4,650,539 | 3/1987 | Irvine et al. | 156/613 |
| 4,804,638 | 2/1989 | Hoke et al. | 437/81 |
| 4,813,049 | 3/1989 | Becla | 357/17 |
| 4,823,177 | 4/1989 | Prinz et al. | 357/27 |

OTHER PUBLICATIONS

Rohatgi et al., "Growth and Characterization of CdMnTe . . . ", Solar Cells, 24, (1988), pp. 185-194.
Mino et al., "Plasma-assisted Metalorganic Chemical Vapor Deposition of ZnSe Films", J. Appl. Phys., 59(6), Mar. 15, 1986, pp. 2216-2221.
Becla, "Infrared Photovoltaic Detectors Utilizing $Hg_{1-x}Mn_xTe$ . . . ", J. Vac. Sci. Technol., A4(4), Jul.-/Aug. 1986, pp. 2014-2018.
Bicknell, R. N. et al., "Stimultated Emission from a $Cd_{1-x}Mn_xTe$-CdTe Multilayer Structure," Appl. Phys. Lett., 46, 238, (1985).
Bicknell, R. N. et al., "$Cd_{1-x}Mn_xTe$-CdTe Multilayers Grown by Molecular Beam Epitaxy," Appl. Phys. Lett., 45, 92, (1984).
Meyers, P. V., "Design of a Thin Film CdTe Solar Cell," Solar Cells, 23, 59, (1988).
Meyers, P. V., "AMTEK's CdTe Solar Module Development Program," Solar Cells, 24, 35, (1988).
Furdyna, J. K., "Dilute Magnetic Semiconductors," J. Appl. Phys., 64, R29, (1988).
Koyanagi, T. et al., "Epitaxial Growth of $Cd_{1-x}Mn_xTe$ Films by Ionized-Cluster Beams and their Magneto-Optical Properties," J. Appl. Phys. 61, 3020, (1987).
Kolodziejski, L. A. et al., "Molecular Beam Epitaxy of $Cd_{1-x}Mn_xTe$", Appl. Phys. Lett., 44, 799, (1984).
Kolodziejski, L. A. et al., "Molecular Beam Epitaxy of Dilute Magnetic Semiconductor ($Cd_{1-x}Mn_xTe$) Superlattices," Appl. Phys. Lett., 45, 440, (1984).

(List continued on next page.)

Primary Examiner—Brian E. Hearn
Assistant Examiner—William Bunch
Attorney, Agent, or Firm—Thomas H. Jones; John R. Manning; Charles E. B. Glenn

[57] ABSTRACT

A method for preparation of a dilute magnetic semiconductor (DMS) film is provided, wherein a Group II metal source, a Group VI metal source and a transition metal magnetic ion source are pyrolyzed in the reactor of a metalorganic chemical vapor deposition (MOCVD) system by contact with a heated substrate. As an example, the preparation of films of $Cd_{1-x}Mn_xTe$, wherein $0 \leq x \leq 0.7$, on suitable substrates (e.g., GaAs) is described. As a source of manganese, tricarbonyl (methylcyclopentadienyl) maganese (TCPMn) is employed. To prevent TCPMn condensation during the introduction thereof into the reactor, the gas lines, valves and reactor tubes are heated. A thin-film solar cell of n-i-p structure, wherein the i-type layer comprises a DMS, is also described; the i-type layer is suitably prepared by MOCVD.

30 Claims, 7 Drawing Sheets

OTHER PUBLICATIONS

Arndt, W. et al., "Wide Bandage Solar Cells for Thin Film Tandem Structures Based on II–IV and I–III–VI2 Compounds," IEEE Reprint No. 0160-8371/85/0000-1671, (1985).

Birkmire, R. W. et al., "CuInSe$_2$/CdS-CdTe/CdS Polycrystalline Tandem Solar Cells," IEEE Reprint No. CH2019-8/84/0000-1406, (1984).

Birkmire, R. W. et al., "CdTe/CdS Devices for Tandem Solar Cells Based on CuInSe$_2$," IEEE Reprint No. 0160-8371/85/0000-1413, (1985).

Bloss, W. H. et al., "Thin Film Tandem Solar Cells Based on II–VI Compounds," IEEE Reprint No. CH2019-8/84/0000-0715, (1984).

Fan, J. C. C. et al., "Optimal Design for High-Efficiency Tandem Cells," IEEE Reprint No. 0160-8371/82/0000-0692, (1982).

PREPARATION OF DILUTE MAGNETIC SEMICONDUCTOR FILMS BY METALORGANIC CHEMICAL VAPOR DEPOSITION

BACKGROUND OF THE INVENTION

1. Origin of the Invention

The invention described herein was made in the performance of work under a NASA contract, and is subject to the provisions of Public Law 96-517 (35 U.S.C. 202) in which the Contractor has elected not to retain title.

2. Field of the Invention

This invention relates to dilute magnetic semiconductors, and more particularly, to preparation of a semiconductor film of the CdTe-MnTe alloy system by metalorganic chemical vapor deposition.

3. Description of the Relevant Art

Dilute magnetic semiconductors (DMS) are pseudobinary Group II–Group VI semiconductors in which a fraction x of the Group II elemental sites are occupied by a transition metal magnetic ion, usually Mn. The CdTe-MnTe alloy system is perhaps the most extensively studied member of this class of materials. Single phase solid solutions of this II–VI semiconductor with zincblende structure are formed in the system $Cd_{1-x}Mn_xTe$, wherein $0 \leq X \leq 0.7$. The energy gap at room temperature ($E_g = 1.50 + 1.34 \times eV$) and lattice constant ($a_o = 6.487 - 0.149 \times Å$) vary linearly throughout this range, even though MnTe has a different structure (nickel arsenide) from that of CdTe (zincblende). The presence of the paramagnetic manganese ions in the host lattice (CdTe) gives rise to interesting magnetic and magneto-optical properties because of spin-exchange interactions with conduction band electrons and valence band holes which modify the band structure. Such interesting phenomena include a giant Faraday rotation near the fundamental absorption edge, an extremely large negative magneto-resistance, Stokes-shifted spinflip Raman scattering, and very large electronic g-factors.

Heteroepitaxial thin films of (CdMn)Te have heretofore been deposited by molecular beam epitaxy (MBE), primarily on GaAs substrates. Subsequently, multiple quantum well and superlattice structures also have been prepared. These structures have exhibited strong photoluminescence, stimulated emission and magnetically tuneable lasing action. It is well known, however, that MBE deposition is not the method of choice for commercial-scale preparation of components for photovoltaic and magneto-optical devices, uses for which a (CdMn)Te or similar DMS would otherwise be well-suited on account of their properties. For example, (ZnMn)Se is of particular interest, as its bandgap lies in the visible wavelength range. At the very least, MBE deposition considerably increases unit production costs for products relative to those prepared by metalorganic chemical vapor deposition (MOCVD) techniques. As compared with MBE deposition, MOCVD permits higher through-put sample growth and allows for deposition of a film over a larger, more uniform area. Thus, MOCVD techniques, if applicable, would significantly reduce costs and simplify manufacture.

Growth of (CdMn)Te has also been accomplished by ionized cluster beam deposition (T. Koyanagi et al., J.Appl.Phys. 61, 3020 (1987)). As is the case with MBE deposition, however, such a process would also not be practical for commercial applications. In particular, ionized cluster beam deposition methods require the use of high vacuums, although not as high as with MBE methods. Moreover, deposition rates are generally low, and there are problems with deposition area and uniformity.

There has been to date no report of (CdMn)Te deposition by MOCVD techniques, although high-quality heteroepitaxial CdTe films have been grown on GaAs, InSb and sapphire substrates. One practical reason for this has probably been the lack of a reasonably high vapor pressure metal alkyl source for Mn.

STATEMENT OF INVENTION

It is an object of the invention to provide a method for preparation of (CdMn)Te and other ternary dilute magnetic semiconductors which would permit treatment of larger area substrates and growth of the required thicknesses in less time.

It is a further object of the invention to provide a method whereby (CdMn)Te and other ternary DMS can be prepared without the need for expensive high-vacuum capital equipment, such as is required for MBE deposition.

It is another object of the invention to provide a method for heteroepitaxial growth of semiconductor layers of alloy systems, such as (CdMn)Te, which will permit commercial-scale preparation of DMS films in an efficient and reproduceable manner.

In accordance with these and other objects, the invention comprises in a first aspect thereof a method for preparation of a semiconductor layer by heteroepitaxial growth of a dilute magnetic semiconductor alloy on a suitable substrate by metalorganic chemical vapor deposition. The substrate in the deposition zone of a metal-organic chemical vapor deposition system is heated to an elevated temperature. A gas mixture comprising a carrier gas and sources of Group II metal (e.g., Cd, Zn and Hg), Group VI metal (e.g., Te, S and Se) and transition metal magnetic ion (e.g., Mn and Fe) are introduced into the reactor. By contacting the gas mixture with the heated substrate, the metal sources are pyrolyzed and a ternary alloy DMS film is formed.

In a preferred embodiment of the inventive method, the DMS is an alloy of the system $Cd_{1-x}Mn_xTe$, wherein $0 < X \leq 0.7$. Dimethyl cadmium (DMCd), diethyltellurium (DETe) and tricarbonyl (methylcyclopentadienyl) manganese (TCPMn) are suitable metalorganic source materials. To accommodate the use of TCPMn as a manganese source, heated gas lines, valves and reactor tubes are employed. In addition, the TCPMn is heated to provide the required vapor pressure.

In accordance with another aspect of the invention, a thin film solar cell of an n-i-p structure is provided, wherein the i-type layer comprises a dilute magnetic semiconductor. The i-type layer is suitably prepared by an MOCVD method. The preparation of such a solar cell with a $Cd_{1-x}Mn_xTe$ insulator layer (x=0.15) and its practical applications in a tandem cell system are disclosed.

DETAILED DESCRIPTION OF THE INVENTION

This invention demonstrates for the first time the feasibility of heteroepitaxial growth of DMS films, such as $Cd_{1-x}Mn_xTe$ films, on suitable substrates, such as (100) GaAs substrates, by atmospheric or reduced pressure MOCVD. These products exhibit crystallographic properties similar to those of MBE-grown films. Films with Mn atomic fractions up to 55% have been grown with uniform Mn concentration throughout the film, by suitable adjustment of operating parameters such as gas flow rates in a manner well-known in the MOCVD field. In addition, the inventive method permits the deposition of other DMS films in an efficient and economical manner.

On account of their desirable properties, DMS films prepared by the method of the invention have a wide range of practical applications, as is well known in the art. As an example, deposition of (CdMn)Te films with a bandgap energy of about 1.7 eV ($x=0.15$) on CdS thin films for use as a higher bandgap solar cell on a cascaded multiple-junction tandem solar cell is illustrated. Through the use of suitable masks, moreover, it is possible to coat only portions of the substrate, thereby facilitating manufacture of patterned products.

The MOCVD deposition may be carried out at atmospheric or reduced pressure. In fact, the use of lower pressures (on the order of about 0.1 atmospheres) may in certain instances provide products with superior morphology and uniformity in thickness over large areas. The use of such reduced pressures has received increasing attention of late in the MOCVD of Group III-V materials. While it is a particular advantage of the inventive method that DMS films may be produced at atmospheric pressure, the use of moderately reduced pressures does not present technical difficulties which would inhibit the development of commercial-scale methods, at least not to the extent as is the case with the significantly more stringent vacuum requirements of MBE or ionized cluster beam methods.

As is well known in the art, a wide range of substrates may be employed in addition to the GaAs substrate described in the examples. On account of the good lattice match, InSb is particularly suitable. In addition, sapphire and especially silicon substrates are of high technological interest. Moreover, buffer layers (for example, CdTe) or superlattices (e.g., CdTe/ZnTe, (CdMn)Te/CdTe and (CdZn)Te/CdTe) of appropriate thicknesses may suitably be employed to improve surface properties and crystallinity.

A further parameter which permits the preparation of products having a range of different properties is the choice of specific orientation relationship. In addition to a (100) substrate/(100) film relationship, for example, off-axis orientation of the exemplary (100) GaAs substrate may suitably be introduced in the (110) or (111) directions. At present, off-axis orientations of up to 13° or more toward the (110) or (111) direction are contemplated with GaAs substrates. Si substrates having both (100) and (111) orientations may also be employed.

The nucleation and growth stages of the DMS layers are affected by a variety of factors, including initial gas flow conditions and substrate surface characteristics and temperature. As in conventional MOCVD procedures, flow rates and linear flow velocities may be varied within fairly broad ranges, both for individual sources and for transport gas, so as to change the composition of the final product and/or modify the growth rate. Linear flow velocities on the order of about 1–10 cm/sec for combined metal source(s)/transport gas would be suitable, for example, in a typical growth system as is described in the examples. As the morphology of the substrate surface can have a significant effect on the orientation relationship, preparation of products having optimum characteristics may in some instances require surface treatment of a given substrate, such as pre-cleaning or in-situ oxide removal. In particular systems, additional factors specific to such systems will also influence growth orientation and product morphology. For example, Te passivation of Ga and As bonds may, in some situations, suggest preintroduction of the Te gaseous source in MOCVD of (CdMn)Te on GaAs.

In principle, growth orientation and surface morphology in the preparation of these DMS systems have a direct influence on the electronic properties of the final product, as a consequence of the resultant interfacial atomic arrangements and generation of faults in the system (e.g., misfit dislocations, stacking faults, microtwins, etc.). By suitable selection in any given instance, it is possible to reduce the density of interfacial dislocations. Control of the dislocation density is important in many systems, for example, to reduce interdiffusion of elements from different layers in a multi-layer system via pipe diffusion mechanisms. By controlling the growth of a layer so that it has a particular orientation, it is possible in many instances to obtain a product having a greatly reduced number of defects. Depositions under reduced pressures in particular may permit preparation of ultra-thin layers having abrupt interfaces. In addition, in multiple layer or superlattice structures, the thickness of intermediate layers will also influence sample growth; as an example, a CdTe intermediate layer of a thickness of 200 Å or less will induce pseudomorphic (and thus, substantially dislocation-free) growth. If properly grown (i.e., with appropriate layer thicknesses and very abrupt interfaces), such structures may serve as effective dislocation filters.

As in conventional MOCVD of binary films, a wide range of metal sources and carrier gases may be employed. For example, suitable Cd sources include dimethyl- and diethyl cadmium; Te sources include dimethyl-, diethyl- and dibutyltellurium; and carrier gases include hydrogen, nitrogen, argon and helium. In addition to other metalorganic source materials, moreover, certain inorganic sources (e.g., metal carbonyls) may be suitable in some instances. According to the inventive method, it is possible to introduce a variety of dopants, such as As, P and Sb (for p-type layers) or Ga, In and Cl (for n-type layers). By adjustment of, e.g., source temperature and flow rates, a variety of desired elements may be introduced into the particular system of interest in a manner well within the skill of a person familiar with MOCVD methods employing the corresponding source materials.

The invention may be better understood with reference to the accompanying examples, which are provided solely for purposes of illustration and should be viewed as in no way limiting the scope of applicants' invention.

EXAMPLE 1

To illustrate the method of the present invention, the following exemplary description is provided of heteroepitaxial growth of $Cd_{1-x}Mn_xTe$ films on (100) GaAs substrates by atmospheric pressure MOCVD.

The growth system used comprised a horizontal quartz reactor tube operating at atmospheric pressure with an RF-heated graphite susceptor. The metalorganic sources for the Cd and Te were dimethylcadmium (DMCd) and diethyltellurium (DETe), respectively. The transport gas was palladium-diffused high purity $H_2$. The DMCd source was held at a temperature of 0° C., and the DETe source at 27° C. The total flow rate of $H_2$ and metalorganics was about 4 l/min, corresponding to a linear flow velocity of about 3 cm/sec over the substrate.

Films of CdTe were first grown at temperatures of 400–430° C. on GaAs substrates (100) misoriented 2° toward the (110) direction. The substrates were cleaned in organic solvents and etched with a $H_2SO_4$:$H_2O_2$:$H_2O$ solution (5:1:1) for 30 seconds. After loading the substrates, the system was pumped down to about 50 micro-Torr and then brought up to atmospheric pressure under $H_2$, at which time the substrate was heated to the growth temperature. The partial pressures of the Cd and Te sources during deposition were typically about $8 \times 10^{-5}$ atm and $1.6 \times 10^{-4}$ atm, respectively. Films of CdTe with thicknesses of 2 μm were deposited with excellent surface morphology and crystallinity.

For the growth of (CdMn)Te, the Mn source used was tricarbonyl(methyl-cyclopentadienyl) manganese (TCPMn) as obtained from a commercial supplier. TCPMn (M.P.=1.5° C.) is a liquid at room temperature with vapor pressures of 0.5 and 12 Torr at 20° C. and 112° C., respectively. No temperature dependence of the vapor pressure has been reported to date, even though TCPMn has been used as a source for Mn doping of MOCVD-grown ZnS and ZnSe epitaxial layers. At constant deposition temperatures and flow rates, the Mn concentration in the film increased exponentially with the temperature of the bubbler, with a sharp increase in TCPMn vapor pressure as the source temperature was raised above about 100° C. Suitable TCPMn source temperatures are generally in the range of 100–150° C. for atmospheric pressure MOCVD, with temperatures of about 120–140° C. being preferred. There was also an indication that the cracking temperature of TCPMn is about 450° C., with partial decomposition occurring in the temperature range of 400–450° C.

A number of depositions were made of (CdMn)Te on GaAs as well as on glass substrates using the same flow rates of $H_2$, DMCd and DETe as used for CdTe deposition. The TCPMn source was heated to a temperature in the range of 120° C. to 140° C. The tubing, valves and front end of the reactor tube were heated at least 100° C. in order to prevent condensation of the TCPMn, which had been observed to occur in the absence of such heating. Substrate temperatures ranged from 410° C. to 450° C.

Figure 1:
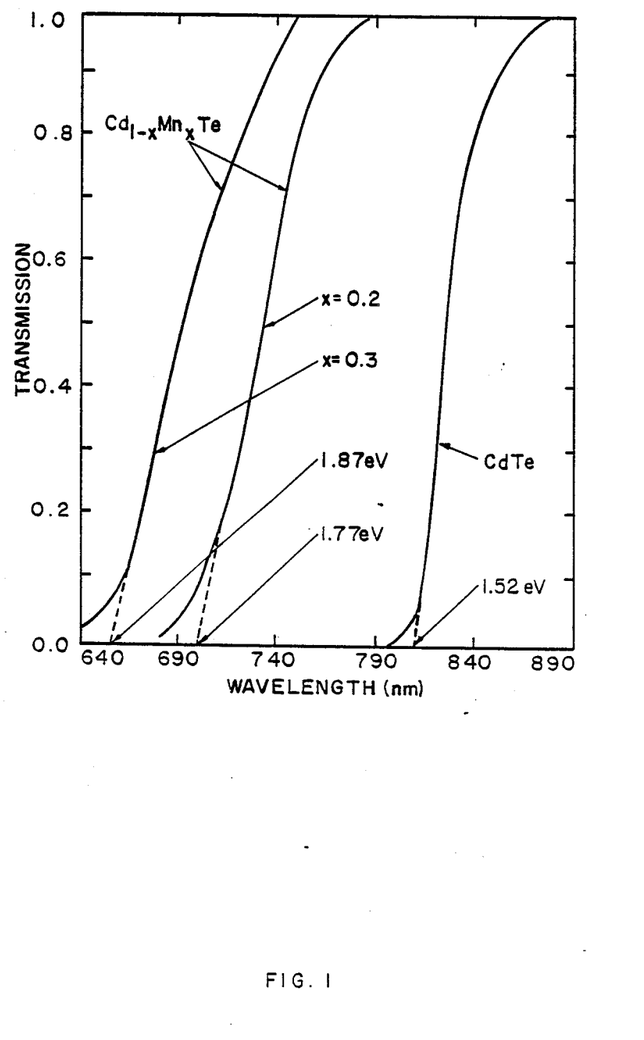
FIG. 1 illustrates the optical transmission curve for a CdTe film and two $Cd_{1-x}Mn_xTe$ films wherein x=0.2 and x=0.3, respectively.

Since the vapor pressure (and hence, mole fraction) of the Mn source was not accurately known, a series of depositions were made on glass substrates and optical transmission measurements taken to determine the energy bandgap. From this data, the percentage of Mn in the deposited film was determined using the known bandgap-composition relation. FIG. 1 shows the optical transmission curves for a CdTe film along with two $Cd_{1-x}Mn_xTe$ films wherein $x=0.2$ and 0.3, with extrapolated bandgap energies (assuming constant reflection over the wavelength range) of about 1.52, 1.77 and 1.87 ev, respectively. These data match quite well with similar data reported for $Cd_{1-x}Mn_xTe$ films deposited by ionized cluster beams.

As is the case for CdTe growth on GaAs, the orientation of the $Cd_{1-x}Mn_xTe$ crystalline layer on (100) GaAs was either (100) or (111), depending upon the initial growth conditions. This phenomenon has been observed for CdTe deposited by MBE as well as for MOCVD, and has also been reported for MBE-grown (CdMn)Te.

Figure 2:
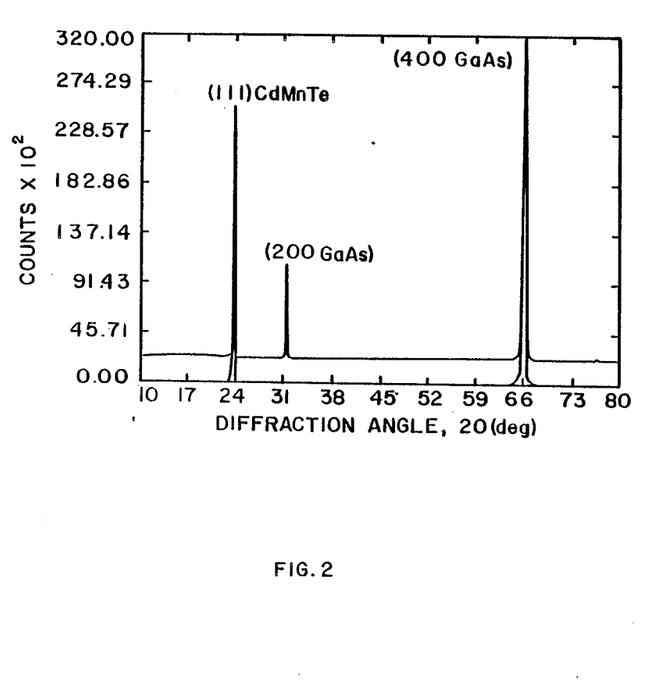
FIG. 2 illustrates the x-ray diffraction curve for a 2-μm thick $Cd_{0.8}Mn_{0.2}Te$ film grown on a (100) GaAs substrate.

FIG. 2 shows two x-ray diffraction scans of $Cd_{1-x}Mn_xTe$ films wherein $x=0.2$, the films having slightly different thicknesses. These data reproduce exactly those reported for MBE-grown $Cd_{1-x}Mn_xTe$ on GaAs.

Figure 3:
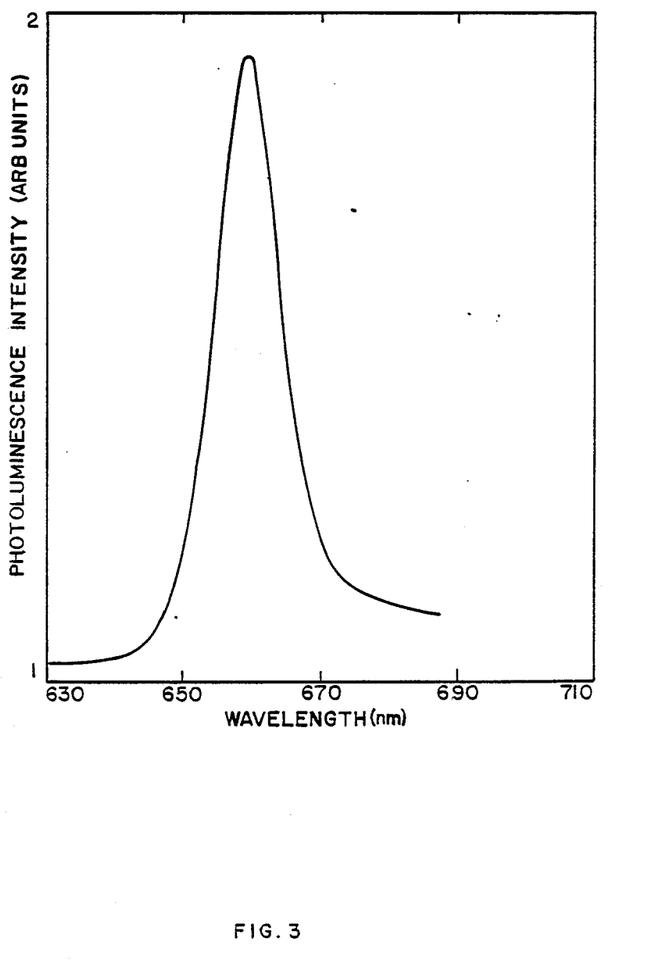
FIG. 3 is the photoluminescence intensity curve of a $Cd_{0.75}Mn_{0.25}Te$ film grown on a (100) GaAs substrate when excited at 10K by a 488 nm wavelength argon laser.

Strong photoluminescence was observed at low temperatures (10–15K) in $Cd_{1-x}Mn_xTe$ films grown on (100) GaAs substrates excited by a 488 nm argon laser. FIG. 3 shows the spectrum observed for a $Cd_{0.75}Mn_{0.25}Te$ film at T=10K. The full width at half maximum (FWHM) of about 33 meV is an indication of the good crystalline quality of the layer.

Figure 4:
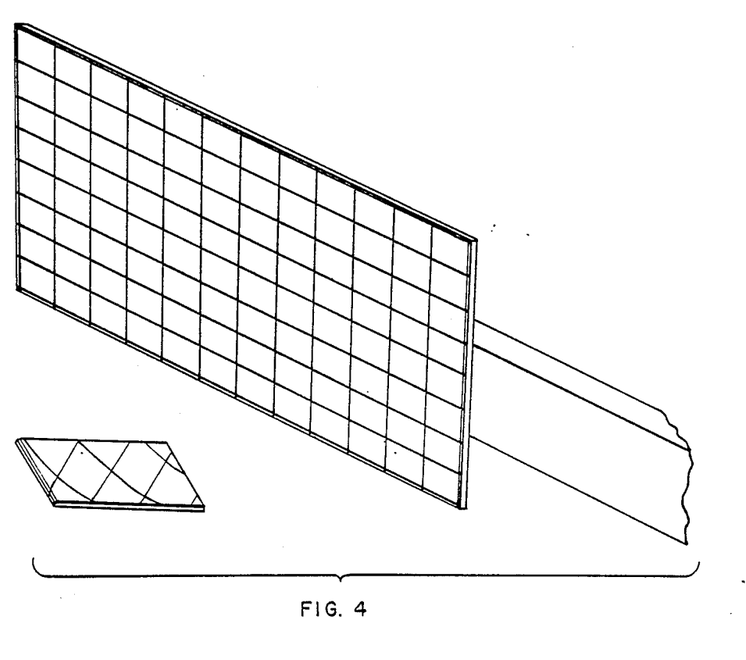
FIG. 4 is a photograph of a $Cd_{0.8}Mn_{0.2}Te$ layer on GaAs illustrating its specular characteristics.
Figure 5:
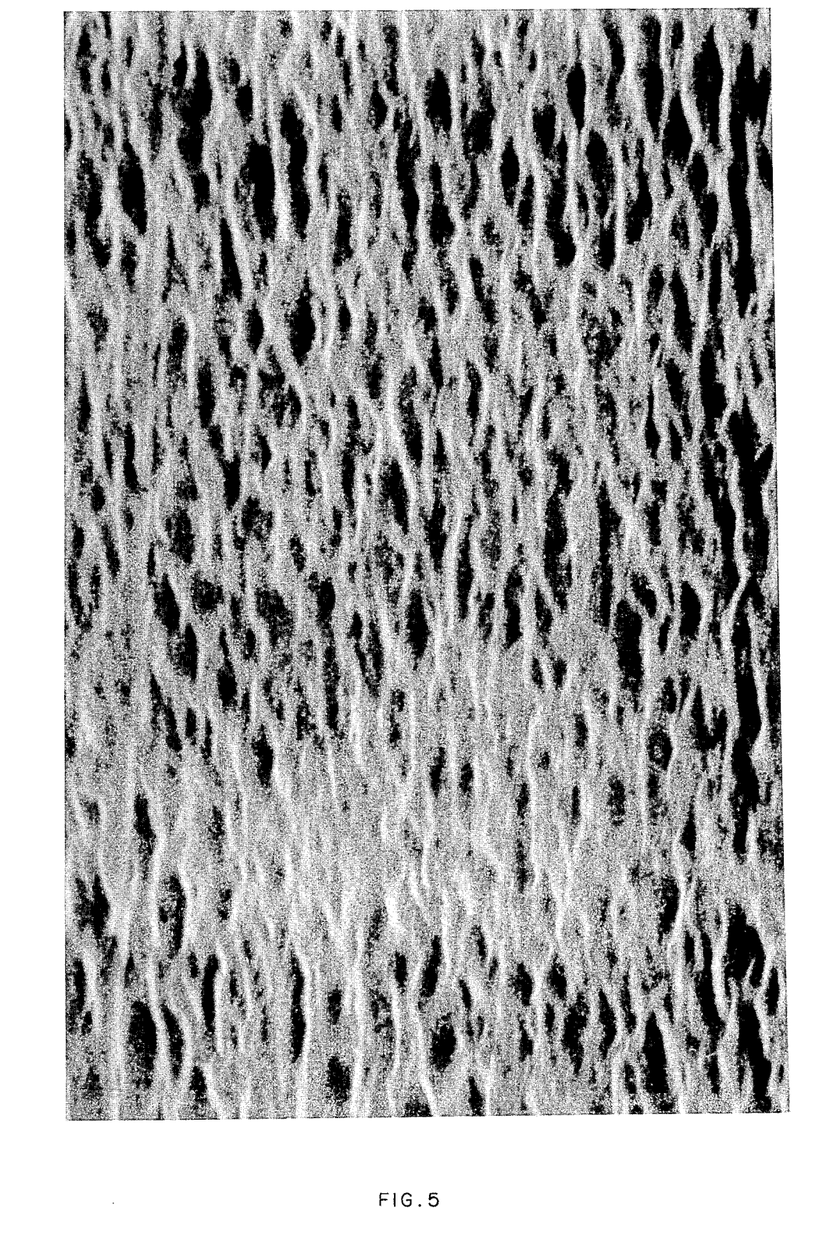
FIG. 5 is a scanning electron microscope (SEM) micrograph of a $Cd_{0.8}Mn_{0.2}Te$ layer on a (100) GaAs substrate misoriented 2° toward the (110) direction, showing surface morphology at a tilt angle of 70° C.

The surface topography of CdTe films on GaAs was featureless when viewed with a light microscope and showed no indication of cracking or peeling. The films also presented a "mirrorlike" reflectance to the naked eye with no hazy areas. However, when Mn was added to the films, haziness was observed in some cases. Attempts to modify the morphology with changes in the carrier gas flow rate, the mole fraction ratio of Te to Cd/Mn, and substrate temperature have not yet provided a conclusive relationship among these factors; nevertheless, (CdMn)Te films having a smooth and mirrorlike surface morphology have been obtained, such as illustrated in FIG. 4. This suggests that the milky appearance of some films is probably related to aspects of the process and system during preliminary experiments, rather than being an inherent material problem. For example, the importance of remaining below 440° C. when growing CdTe on GaAs MOCVD has been reported in the literature, due to suspected formation of Te crystallites on the substrate in films grown above that temperature. Nonetheless, for all practical purposes films of a suitable quality are routinely prepared by the inventive method. A closer look at the surface of an exemplary (CdMn)Te film by a scanning electron microscope (FIG. 5) shows a very light ripple effect with features having dimensions of only about several thousand angstroms.

EXAMPLE 2

This example describes the preparation of high efficiency thin-film solar cells. Conventional solar cells having a single bandgap $E_g$ are limited in conversion efficiency since absorbed photons with energy in excess of $E_g$ have that excess energy wasted as heat. However, even after considering additional practical losses, such as series resistance, contact shadowing and processing-induced defects, efficiencies as high as 23 percent at one sun intensity have been obtained for single crystal laboratory cells made from Si or GaAs. Thin-film solar cells, highly desirable because of their potential low cost, have considerably lower efficiencies. This is due mainly to material imperfections, which lead to recombination losses and to non-ideal p/n junction characteristics. The highest reported laboratory efficiencies are in the 11-12 percent range for both CdTe/CdS and CuInSe$_2$/CdS heterojunction thin-film solar cells.

One method proposed for further increasing efficiencies is that of optically stacking in tandem two or more junction devices having different values of $E_g$ (J.C.C. Fan et al., Proc. 16th Photovoltaic Specialistic Conf., p. 692 (1982)). The uppermost (sunlit side) thin film material must absorb higher energy photons while transmitting most of the longer wavelength photons for absorption in the lower cell. The stacked cells can be either two-terminal monolithic devices (presenting particularly difficult materials growth and processing considerations), or four-terminal devices, formed by joining single-junction devices, deposited on conductive oxide-coated glass substrates in optical series. In either case, development of a higher energy bandcap cell has heretofore been most difficult, as the optimum $E_g$ value of about 1.7 eV can only be obtained with ternary compounds.

Figure 6:
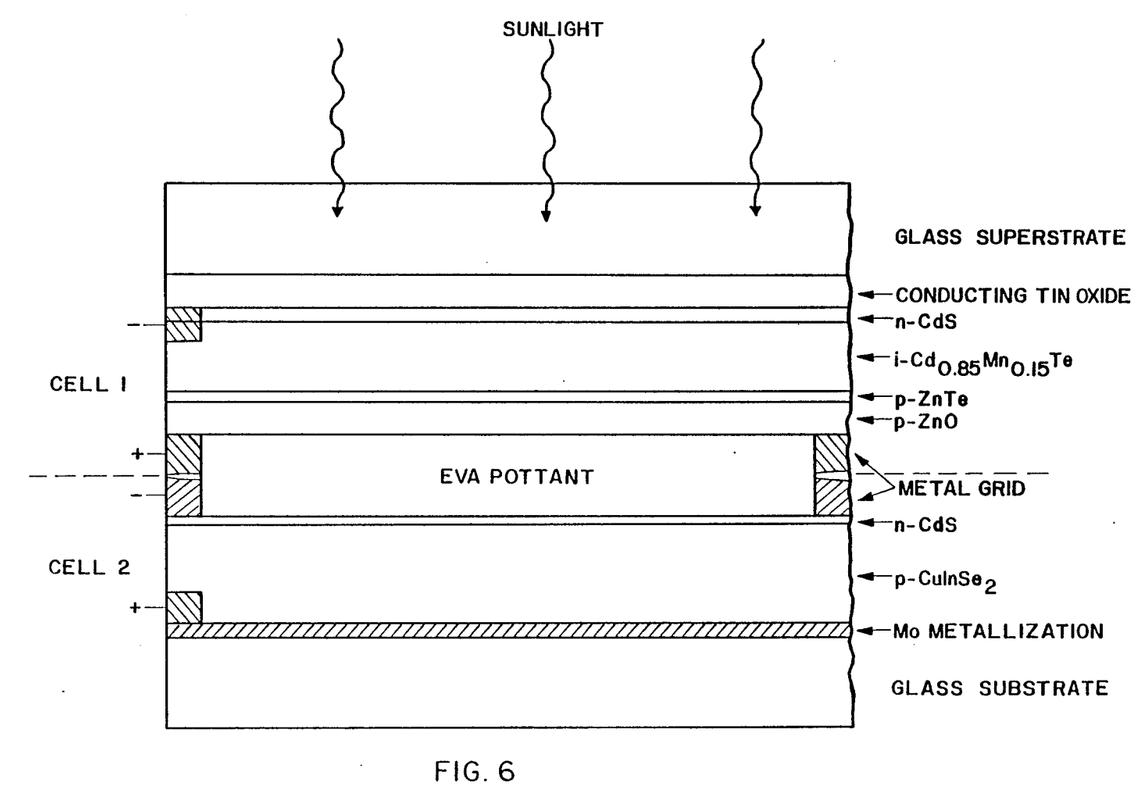
FIG. 6 illustrates a tandem solar cell including a $Cd_{1-x}Mn_xTe$ layer prepared in accordance with the invention.
Figure 7:
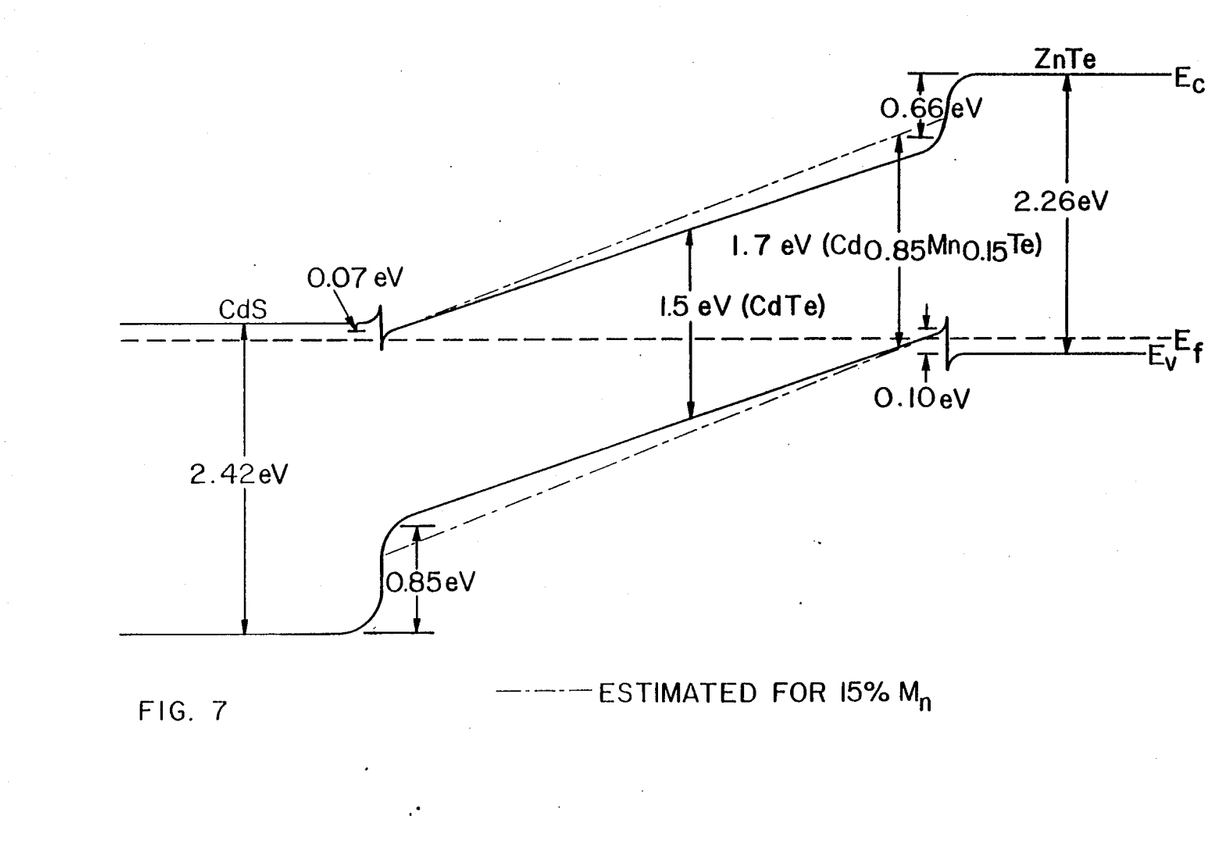
FIG. 7 illustrates a suggested energy band line-up at zero bias for a $Cd_{1-x}Mn_xTe$ layer wherein $x=0.15$, based on experimental valence band offsets obtained by synchrotron radiation photoemission.

An example of such a tandem cell is depicted in FIG. 6 for the case of a lower bandgap cell comprising a CdS/CuInSe$_2$ solar cell. The upper cell absorbing material was Cd$_{1-x}$Mn$_x$Te, wherein x=0.15. The n-i-p structure was originally suggested for electrodeposited CdTe (P. V. Meyers, Solar Cells 23, 59 (1988); P. V. Meyers, Solar Cells 24, 35 (1988)). It would seem to be even more appropriate for a higher bandgap ternary compound of CdTe because of the expected difficulty in strongly doping p-type and providing adequate ohmic contact. FIG. 7 shows a suggested energy band lineup at zero bias based on experimental valence band offsets obtained by synchrotron radiation photoemission. These data show that the conduction band offset for CdS/CdTe (common cation) and the valence band offset for CdTe/ZnTe (common anion) are quite low, as also predicted by some theories. Although no data have been reported for the (CdMn)Te system, it would seem reasonable to represent its effects with CdS and ZnTe as shown in FIG. 7 by the dashed lines, taking into account the difference in energy bandgaps from CdTe.

If the i-layer is thin enough so that it is almost fully depleted (about 1.5-2.0 μm thick) as shown in FIG. 7, current collection is aided by the built-in electric field, thereby reducing the need for long minority carrier diffusion lengths. The use of the p-type ZnTe layer not only provides a second current collecting heterojunction, but also greatly alleviates a potentially serious contacting problem with the photon-absorbing layer.

The growth system, metalorganic sources and operating parameters, unless otherwise indicated, were the same as in Example 1. Films of CdTe were first grown in these experiments at temperatures of 300°-400° C. on glass substrates, followed by depositions of (CdMn)Te on glass substrates using the same flow rates of H$_2$, DMCd and DETe as used for CdTe deposition.

Initial experiments for solar cell fabrication focused on CdTe in order to optimize growth and post-growth heat treatment parameters, and to analyze CdS/CdTe heterojunction characterization in comparison with electrodeposited CdTe. CdS was first pyrolytically deposited on SnO$_2$-coated glass substrates purchased from a commercial supplier. After CdTe deposition in the MOCVD reactor and a heat treatment in air under controlled conditions, a copper-doped layer of ZnTe was vacuum evaporated onto the CdTe at 250° C. to a thickness of about 600 Å. Finally, a back contact of gold or nickel was evaporated.

Small area devices were defined from the 2 cm×2 cm substrate by scribing, and indium contacts made to the SnO$_2$ coating at one edge. Standard photovoltaic measurements were then made using simulated AM 1.5 sunlight entering through the CdS side of the solar cell. Spectral response, dark (i.e., non-illuminated) current-voltage and capacitance-voltage characteristics were measured in the usual way.

After optimization of CdTe (and subsequently, (CdMn)Te) deposition parameters on glass and crystalline GaAs substrates, depositions were made on polycrystalline CdS films. Because of concerns that interdiffusion at the interface might cause leaky heterojunction performance, and hence, poor open circuit voltage ($V_{oc}$), substrate temperatures were initially kept as low as possible (i.e., about 410° C.). The thickness of CdTe was typically about 1.5-2.0 μm after 30 minutes of growth at that temperature. A depth profile of the solar cell structure after annealing and ZnTe overcoating showed a reasonably sharp interface between the CdS and CdTe. The sputter etching rate during this profiling was about 175-200 Å/minute. More importantly, good junction performance was observed with a value for $V_{oc}$ of 675 mV and a short-circuit current density ($J_{sc}$) of 20.6 mA/cm$^2$ under 100 mW/cm$^2$ illumination. Very good spectral response was obtained when light entered the CdS side, while the response at short wavelengths, though reduced for light entering the ZnTe side, shows the presence of an active junction between the CdTe and ZnTe.

Later attempts using a deposition temperature of 440° C. gave mixed results. At least one device showed over 7.3% efficiency, but several other devices showed excessive leakage currents. Growth at the higher temperature would be preferred, though not necessary, since the growth rate of the (CdMn)Te would be higher.

After optimization of operating parameters, several solar cell structures were fabricated having efficiencies over 9%. One set of samples from one 4 cm$^2$ substance averaged 9.4% efficiency, showing good dark I-V characteristics. The values of $V_{oc}$ (697 mV) and $J_{sc}$ (22.1 mA/cm$^2$) compare very favorably with the best reported values for CdTe/CdS cells using alternative CdTe deposition techniques. Only a low fill factor of 50-55 percent prevented an efficiency of 10 percent or greater. The low fill factor, apparently due to high series resistance, could be caused either by the fact that the CdTe layer thickness (2.0-2.1 microns) for that sample is larger than the depletion width and/or by degradation of the SnO$_2$ conductive coating during the MOCVD growth. Reflecting the increased magnitude of $J_{sc}$, spectral response measurements of the sample showed average quantum efficiency of 85% between 500 and 800 μm.

The preliminary photovoltaic results of similar structures when substituting $Cd_{0.85}Mn_{0.15}Te$ for CdTe confirmed the feasibility of such a system. Consideration of band effects make the CdS/CdTe or (CdMn)Te/ZnTe n-i-p solar cell structure very attractive because of the low offsets, and thus, low potential barriers for minority carriers, along with large offsets for majority carriers which may act as "mirrors", reducing interface losses. The most useful aspect of the n-i-p structure, when properly implemented, is that the p-type doping and ohmic contacting problems encountered with CdTe-related compounds may be avoided.

What we claim is:

1. A method of preparing a dilute magnetic semiconductor film on a substrate in a deposition zone of a reactor of a metalorganic chemical vapor deposition system, said method comprising:
heating the substrate in the deposition zone to an elevated temperature in the range of about 410° to about 450° C.;
introducing into the reactor a gas mixture comprising a Group II metal source, a Group VI metal source a transition metal magnetic ion source, and a carrier gas; and
forming said film by contacting the substrate with said gas mixture, thereby pyrolyzing the metal sources and forming a ternary alloy, whereby the magnetic ion source is incorporated into the lattice structure of said film.

2. A method according to claim 1, wherein said Group II metal is selected from the group consisting of Cd, Zn and Hg.

3. A method according to claim 1, wherein said Group VI metal is selected from the group consisting of Te, S and Se.

4. A method according to claim 1, wherein said transition metal magnetic ion is selected from the group consisting of Mn and Fe.

5. A metal according to claim 1, wherein said dilute magnetic semiconductor is $Cd_{1-x}Mn_xTe$, in which $0 < X \leq 0.7$.

6. A method according to claim 5, wherein said Group II metal source is selected from the group consisting of dimethyl- and diethylcadmium.

7. A method according to claim 5, wherein said Group VI metal source is selected from the group consisting of dimethyl-, diethyl- and dibutyltellurium.

8. A method according to claim 5, wherein said transition metal magnetic ion source is tricarbonyl (methyl-cyclopentadienyl) manganese.

9. A method according to claim 8, wherein said tricarbonyl (methyl-cyclopentadienyl) manganese is provided from a source thereof via supply means maintained at a temperature sufficiently high to prevent condensation of said tricarbonyl (methylcyclopentadienyl) manganese.

10. A method according to claim 9, wherein said temperature is at least 100° C.

11. A method according to claim 9, wherein said source of tricarbonyl (methyl-cyclopentadienyl) manganese is heated to a temperature of about 100° to about 150° C.

12. A method according to claim 1, wherein said carrier gas is $H_2$.

13. A method according to claim 1, wherein said substrate is GaAs.

14. A method according to claim 13, wherein said substrate is (100) GaAs misoriented up to about 13° in a (110) or (111) direction.

15. A method according to claim 1, wherein said substrate is a CdS thin film.

16. A method according to claim 1, wherein said substrate is InSb, silicon or sapphire.

17. A method of preparing a dilute magnetic semiconductor single crystal film of $Cd_{1-x}Mn_xTe$, where $0 < X \leq 0.7$, on a substrate in a deposition zone of a reactor of a metalorganic chemical vapor deposition system, the method comprising:
heating the substrate in the deposition zone to an elevated temperature in the range of about 410°–450° C.;
introducing into the reactor a gas mixture comprising a cadmium alkyl source, a tellurium alkyl source, a manganese alkyl magnetic ion source, and a carrier gas; and
forming said film by contacting the substrate with the gas mixture, thereby pyrolyzing the metal sources and forming a ternary alloy, whereby the magnetic ion source is incorporated into the lattice structure of said film.

18. A method a preparing a dilute magnetic semiconductor single crystal film according to claim 17 wherein the substrate is (100) GaAs misoriented up to about 13° in a (110) or (111) direction.

19. A method of preparing a dilute magnetic semiconductor single crystal film according to claim 17 wherein the alkyl manganese magnetic ion source is tricarbonyl (methyl-cyclopentadienyl) manganese, and wherein said source is heated to a temperature of about 100° to about 150° C.

20. A method of preparing a dilute magnetic semiconductor film on a substrate in a deposition zone of a reactor of a metalorganic chemical vapor deposition system, wherein said dilute magnetic semiconductor is $Cd_{1-x}Mn_xTe$, in which $0 < X \leq 0.7$, the method comprising:
heating the substrate in the deposition zone to an elevated temperature;
introducing into the reactor a gas mixture comprising a Group II metal source, a Group VI metal source, a transition metal magnetic ion source, and a carrier gas; and
forming said film by contacting the substrate with said gas mixture, thereby pyrolyzing the metal sources and forming a ternary metal alloy, whereby the magnetic ion source is incorporated into the lattice structure of said film.

21. A method according to claim 20, wherein said elevated temeprature is in the range of about 410° to about 450° C.

22. A method according to claim 20, wherein the Group II metal source is selected from the group consisting of dimethylcadmium and diethylcadmium.

23. A method according to claim 20, wherein the Group VI metal source is selected from the group consisting of dimethyl-, diethyl- and dibutyltellurium.

24. A method according to claim 20, wherein the transition metal magnetic ion source is tricarbonyl (methyl-cyclopentadienyl) manganese.

25. A method according to claim 24, wherein the tricarbonyl (methyl-cyclopentadienyl) manganese is provided through supply means for supplying a gas from a gas source, the supply means maintained at a temperature sufficiently high to prevent condensation of the tricarbonyl (methyl-cyclopentadienyl) manganese.

26. A method according to claim 25, wherein the temperature is at least 100° C.

27. A method according to claim 25, wherein the source of tricarbonyl (methyl-cyclopentadienyl) manganese is heated to a temperature of about 100° to about 150° C.

28. A method according to claim 20, wherein the substrate is GaAs.

29. A method according to claim 28, wherein the substrate is (100) GaAs misoriented up to about 13° in a (110) or (111) direction.

30. A method according to claim 28, wherein the substrate is a CdS thin film.

* * * * *